US012641795B2

(12) United States Patent
Lee et al.

(10) Patent No.: US 12,641,795 B2
(45) Date of Patent: May 26, 2026

(54) FERROELECTRIC MEMORY DEVICE AND SEMICONDUCTOR DIE

(71) Applicant: Taiwan Semiconductor Manufacturing Company, Ltd., Hsinchu (TW)

(72) Inventors: Ya-Ling Lee, Hsinchu (TW); Chung-Te Lin, Tainan (TW); Han-Ting Tsai, Kaoshiung (TW); Wei-Gang Chiu, New Taipei City (TW); Yen-Chieh Huang, Hsinchu (TW); Ming-Yi Yang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 580 days.

(21) Appl. No.: 18/152,151

(22) Filed: Jan. 10, 2023

(65) Prior Publication Data

US 2024/0081081 A1 Mar. 7, 2024

Related U.S. Application Data

(60) Provisional application No. 63/403,871, filed on Sep. 6, 2022.

(51) Int. Cl.
*H10B 51/30* (2023.01)
*H10B 51/20* (2023.01)
*H10B 53/20* (2023.01)
*H10B 53/30* (2023.01)

(52) U.S. Cl.
CPC ............. *H10B 51/30* (2023.02); *H10B 51/20* (2023.02); *H10B 53/20* (2023.02); *H10B 53/30* (2023.02)

(58) Field of Classification Search
CPC ........ H10B 51/30; H10B 51/20; H10B 53/30; H10B 53/20
See application file for complete search history.

(56) References Cited

U.S. PATENT DOCUMENTS

2021/0313439 A1* 10/2021 Lee ..................... H10D 30/6739
2024/0055517 A1* 2/2024 Chiang .................. H10B 51/30
2024/0172447 A1* 5/2024 Nam ..................... H10D 64/689

* cited by examiner

*Primary Examiner* — Richard A Booth
(74) *Attorney, Agent, or Firm* — JCIPRNET

(57) ABSTRACT

A ferroelectric memory device and a semiconductor die are provided. The ferroelectric memory device includes a gate electrode; a channel layer, overlapped with the gate electrode; source/drain contacts, in contact with separate ends of the channel layer; a ferroelectric layer, lying between the gate electrode and the channel layer; and a first insertion layer, extending in between the ferroelectric layer and the channel layer, and comprising a metal carbonitride or a metal nitride.

20 Claims, 11 Drawing Sheets

100

FERROELECTRIC MEMORY DEVICE AND SEMICONDUCTOR DIE

CROSS-REFERENCE TO RELATED APPLICATION

This application claims the priority benefits of U.S. provisional application Ser. No. 63/403,871, filed on Sep. 6, 2022. The entirety of each of the above-mentioned patent applications is hereby incorporated by reference herein.

BACKGROUND

In recent development of nonvolatile memories, ferroelectric material has been utilized as a storage medium. Information can be stored as a certain polarization state of the ferroelectric material, and such polarization state can be maintained even in absence of a voltage applied across the ferroelectric material. Due to non-volatility and superior data process speed, ferroelectric memory device has attracted considerable attention as a next generation memory device. However, further increase of memory window and endurance is required for improving the ferroelectric memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
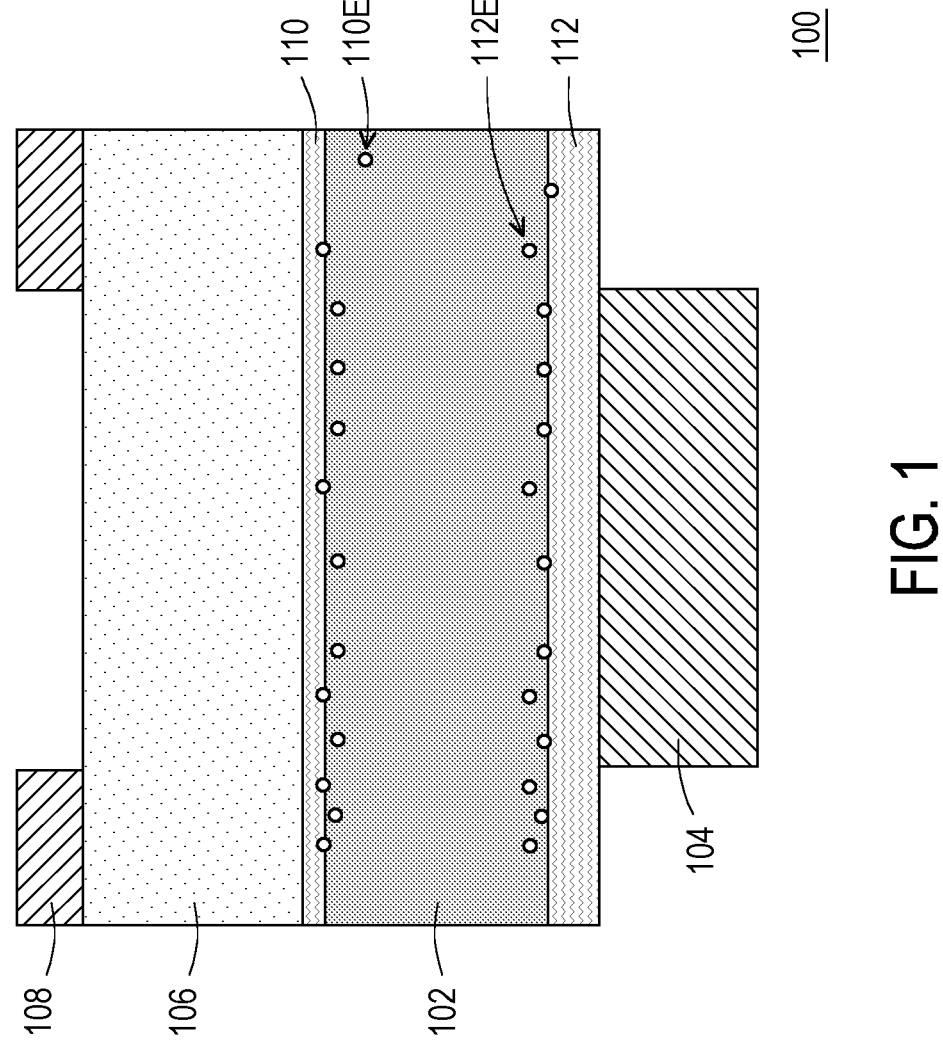
FIG. 1 is a schematic cross-sectional view illustrating a ferroelectric memory device, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, source/drain contacts may each refer to a contact to a source terminal or a contact to a drain terminal. Similarly, source/drain terminals may respectively refer to a source electrode or a drain electrode.

FIG. 1 is a schematic cross-sectional view illustrating a ferroelectric memory device 100, according to some embodiments of the present disclosure.

Referring to FIG. 1, the ferroelectric memory device 100 is a ferroelectric field effect transistor (FET). In the ferroelectric memory device 100, a ferroelectric layer 102 lies between a gate electrode 104 and a channel layer 106, and a pair of source/drain contacts 108 are in contact with separate ends of the channel layer 106. The gate electrode 104 is capacitively coupled to the channel layer 106 through the ferroelectric layer 102. When a gate voltage applied across the ferroelectric layer 102 exceeds a threshold voltage, electrical current can be established through the channel layer 106, and can be sensed at one of the source/drain contacts 108. On the other hand, if the gate voltage does not reach the threshold voltage, such current may be absent or have a very low magnitude.

Particularly, the ferroelectric layer 102 can be programmed with and switched between a first polarization state and a second polarization state having a polarity opposite to a polarity of the first polarization state. By changing the polarization state of the ferroelectric layer 102, the threshold voltage can be altered. For instance, when the ferroelectric layer 102 is programmed with the first polarization state, the ferroelectric memory device 100 may have a low threshold voltage. On the other hand, when the ferroelectric layer 102 is programmed with the second polarization state, a high threshold voltage may be resulted. When a gate voltage greater than the low threshold voltage but lower than the high threshold voltage is provided across the ferroelectric layer 102, the electrical current may be established through the channel layer 106 if the ferroelectric layer 102 is programmed with the first polarization state (which results the low threshold voltage), but may be absent or have a very low magnitude if the ferroelectric layer 102 is programmed with the second polarization state (which results the high threshold voltage). By sensing the electrical current, whether the ferroelectric layer 102 is programmed with the first polarization state or the second polarization state can be identified. In this way, information can be stored in the ferroelectric layer 102 as a specific polarization state. For instance, a logic data "1" can be stored as the first polarization state of the ferroelectric layer 102, while a logic data "0" can be stored as the second polarization state of the ferroelectric layer 102.

In some embodiments, the gate electrode 104 is formed of a single conductive material. In other embodiments, the gate electrode 104 is a multilayer structure including multiple conductive layers formed of a combination of conductive materials. Alternatives of the conductive materials may include titanium nitride (TiN), tantalum nitride (TaN), tungsten and other metallic materials. As similar to the gate electrode 104, the source/drain contacts 108 are respectively formed of one or more of the conductive materials.

The channel layer 106 is formed of a semiconductor material. In some embodiments, the semiconductor material for forming the channel layer 106 is an oxide semiconductor material. Examples of the oxide semiconductor material may include zinc oxide, indium gallium zinc oxide (IGZO), indium oxide, indium zinc oxide (InZnO or IZO), indium tin oxide (ITO), indium oxide (e.g., $In_2O_3$), gallium oxide (e.g., $Ga_2O_3$), indium gallium zinc oxide (InGaZnO or IGZO), zinc oxide (ZnO), aluminum doped zinc oxide (AZO, such as $Al_2O_5Zn_2$), indium tungsten oxide (IWO), titanium oxide, magnesium oxide or the like. In alternative embodiments, the semiconductor material for forming the channel layer 106 is a group IV semiconductor material, a group III-V semiconductor material or a group II-VI semiconductor material. The group IV semiconductor material may include Si, Ge, SiGe, Sn, SiC. In addition, the group III-V semiconductor material may include BN, BP, BAs, AlN, AlP, AlAs, AlSb, GaN, GaP, GaAs, GaSb, InN, InP, InAs, InSb or InGaAs, and the group II-VI semiconductor material may include MgO, MgS, MgSe, MgTe, ZnS, ZnSe, ZnTe, CdS, CdSe, CdTe, HgS, HgSe or HgTe.

The ferroelectric layer 102 is formed of a ferroelectric material. In some embodiments, the ferroelectric material includes hafnium zirconium oxide (HZO). The HZO can be represented as $Hf_xZr_{(1-x)}O_y$, where x may be greater than 0 and less than 1, while y may range from 0.1 to 2. In addition, a tetragonal phase, an orthorhombic phase and a cubic phase in the HZO may be collectively greater than 50% of a total volume of the HZO. Further, in these embodiments, the ferroelectric layer 102 may also include a blocking layer (not shown) lying along a side of the HZO facing toward the channel layer 106. The blocking layer may be formed of silicon doped hafnium oxide, and an atomic ration of silicon in the blocking layer may be greater than 10 at %. In some embodiments, a thickness of the HZO ranges from about 0.1 nm to about 100 nm, while a thickness of the blocking layer ranges from about 0.1 nm to about 10 nm. At an interface (of about 2 nm in thickness) between the blocking layer and the HZO, a ratio of oxygen over zirconium may be equal to or greater than 1, and a ratio of oxygen over hafnium may be equal to or greater than 1.

In alternative embodiments, the ferroelectric material for forming the ferroelectric layer 102 includes hafnium oxide, lead titanate, lead zirconate titanate (PZT), strontium bismuth tantalate (SBT), barium titanate, strontium titanate, Sc-doped aluminum nitride (AlScN) or any other suitable ferroelectric material or combinations thereof, and may also include blocking layer(s) at a side of the ferroelectric layer 102 facing toward the channel layer 106.

Undesirably, inter-diffusion may take place at an interface between the ferroelectric layer 102 and the channel layer 106. In addition, defects (such as oxygen vacancies) may be inevitably formed in the ferroelectric layer 102. Such inter-diffusion and formation of the defects may result in weaker polarization as well as shorter endurance of the ferroelectric layer 102. A memory window (or referred to as a read margin) of the ferroelectric memory device 100 is defined as a difference between the low threshold voltage and the high threshold voltage of the ferroelectric memory device 100, which is resulted from a total remnant polarization of the first and second polarization states of the ferroelectric layer 102. If each of the first and second polarization states is lowered in magnitude (i.e., weaker polarization), a smaller total remnant polarization would be resulted. As a consequence, a difference between the low threshold voltage and the high threshold voltage of the ferroelectric memory device 100 is reduced, thus the ferroelectric memory device 100 may have a narrower memory window (i.e., a smaller read margin). In addition, the endurance of the ferroelectric layer 102 is defined as how may write operations does the ferroelectric layer 102 can maintain its total remnant polarization at a sufficiently high level. A shorter endurance of the ferroelectric layer 102 indicates that fewer write operations can be performed by the ferroelectric memory device 100. In other words, reliability of the ferroelectric memory device 100 may be compromised when the ferroelectric layer 102 has a shorter endurance.

An insertion layer 110 is disposed between the ferroelectric layer 102 and the channel layer 106, to block the inter-diffusion at the interface between the ferroelectric layer 102 and the channel layer 106, and to passivate dangling bonds at the possible defects in the ferroelectric layer 102. The insertion layer 110 may be electrically conductive. In some embodiments, a metal carbonitride such as WCN, TaCN, CrCN, TiCN or TaCN is used for forming the insertion layer 110. In addition, a thermal atomic layer deposition (ALD) process may be performed for forming the insertion layer 110 of the metal carbonitride. Elements 110E in the insertion layer 110 may diffuse into the ferroelectric layer 102. A metal content of the insertion layer 110 may be functioned as a barrier for blocking the inter-diffusion across the interface between the ferroelectric layer 102 and the channel layer 106, while nitrogen and carbon diffused into the ferroelectric layer 102 from the insertion layer 110 may passivate dangling bonds at the possible defects in the ferroelectric layer 102. Therefore, by further disposing the insertion layer 110, memory window and reliability of the ferroelectric memory device 100 can be effectively improved.

In alternative embodiments, the insertion layer 110 is formed of metal nitride by using a thermal ALD process. As similar to the effect of the metal carbonitride, the metal content in the metal nitride may block the inter-diffusion across the interface between the ferroelectric layer 102 and the channel layer 106, and the nitrogen of the metal nitride may diffuse into the ferroelectric layer 102 and passive dangling bonds at the possible defects in the ferroelectric layer 102. Alternatives of the metal nitride may include tungsten nitride (WN), titanium nitride (TiN) and tantalum nitride (TaN).

As indicated in FIG. 1, a surface region of the ferroelectric layer 102 that is in contact with the insertion layer 110 is doped with the elements 110E of the insertion layer 110. The elements 110E diffusing into the ferroelectric layer 102 may be rich in the surface region, and may gradually decrease away from the surface region. Concentration profile of the elements 110E in the ferroelectric layer 102 may vary, according to process temperature of the thermal ALD process and/or material selection of the insertion layer 110 and the ferroelectric layer 102. The present disclosure is not limited to the concentration profile of the elements 110E in the ferroelectric layer 102.

Figure 2A:
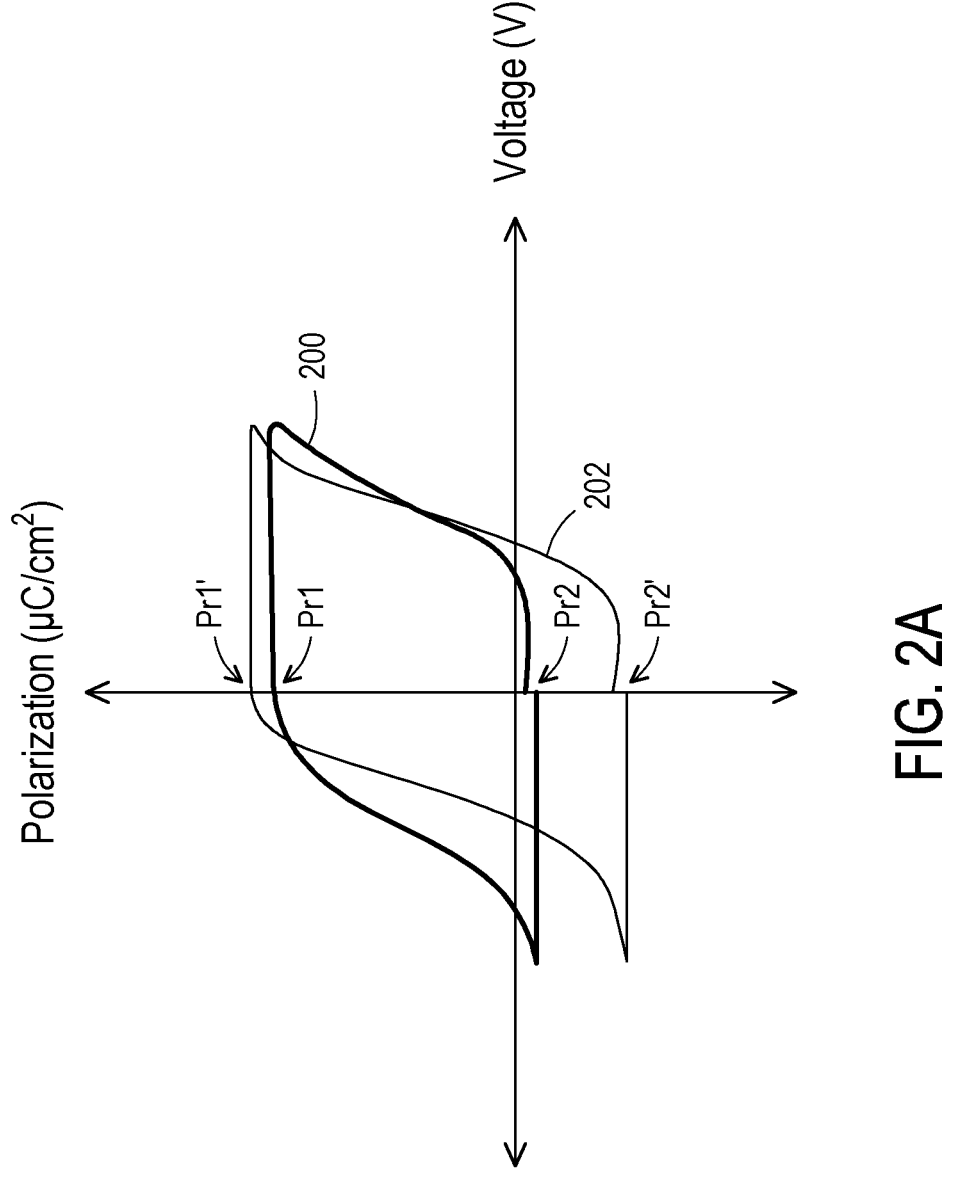
FIG. 2A is a plot diagram illustrating a hysteresis loop of a ferroelectric layer in a ferroelectric memory device with an insertion layer lying between the ferroelectric layer and a channel layer, and illustrating another hysteresis loop of a ferroelectric layer in a ferroelectric memory device without the insertion layer lying between the ferroelectric layer and a channel layer.

FIG. 2A is a plot diagram illustrating hysteresis loops 200, 202 of the ferroelectric layer 102 with and without being covered by the insertion layer 110. A vertical axis in FIG. 2A shows magnitude of polarization in the ferroelectric layer 102, while a horizontal axis in FIG. 2A shows voltage applied across the ferroelectric layer 102.

The hysteresis loop 200 indicates polarization of the ferroelectric layer 102 without being covered by the insertion layer 110, with respect to varying voltage applied across the ferroelectric layer 102. Intersections of the hysteresis loop 200 and the vertical axis (i.e., zero voltage across the ferroelectric layer 102) define a remnant polarization Pr1 and a remnant polarization Pr2 in the ferroelectric layer 102. The remnant polarization Pr1 and the remnant polarization Pr2 having opposite polarity are each an amount of polarization remained in the ferroelectric layer 102 while the voltage applied across the ferroelectric layer 102 is removed, and represent the first and second polarization states that can be programmed to the ferroelectric layer 102. A summation (in absolute values) of the remnant polarization Pr1 and the remnant polarization Pr2 relates to the memory window (i.e., read margin) of the ferroelectric memory device 100.

On the other hand, the hysteresis loop 202 indicates polarization of the ferroelectric layer 102 being covered by the insertion layer 110, with respect to varying voltage applied across the ferroelectric layer 102. In a similar way, intersections of the hysteresis loop 202 and the vertical axis define a remnant polarization Pr1' and a remnant polarization Pr2' in the ferroelectric layer 102, which represents the first and second polarization states can be programmed to the ferroelectric layer 102. As shown in FIG. 2A, a summation (in absolute value) of the remnant polarization Pr1' and the remnant polarization Pr2' is much greater than a summation of the remnant polarization Pr1 and the remnant polarization Pr2. As the summation (in absolute values) of the remnant polarizations with opposite polarity indicates the memory window of the ferroelectric memory device 100, it can be verified that the memory window of the ferroelectric memory device 100 can be effectively enlarged by further disposing the insertion layer 110 between the ferroelectric layer 102 and the channel layer 106.

Figure 2B:
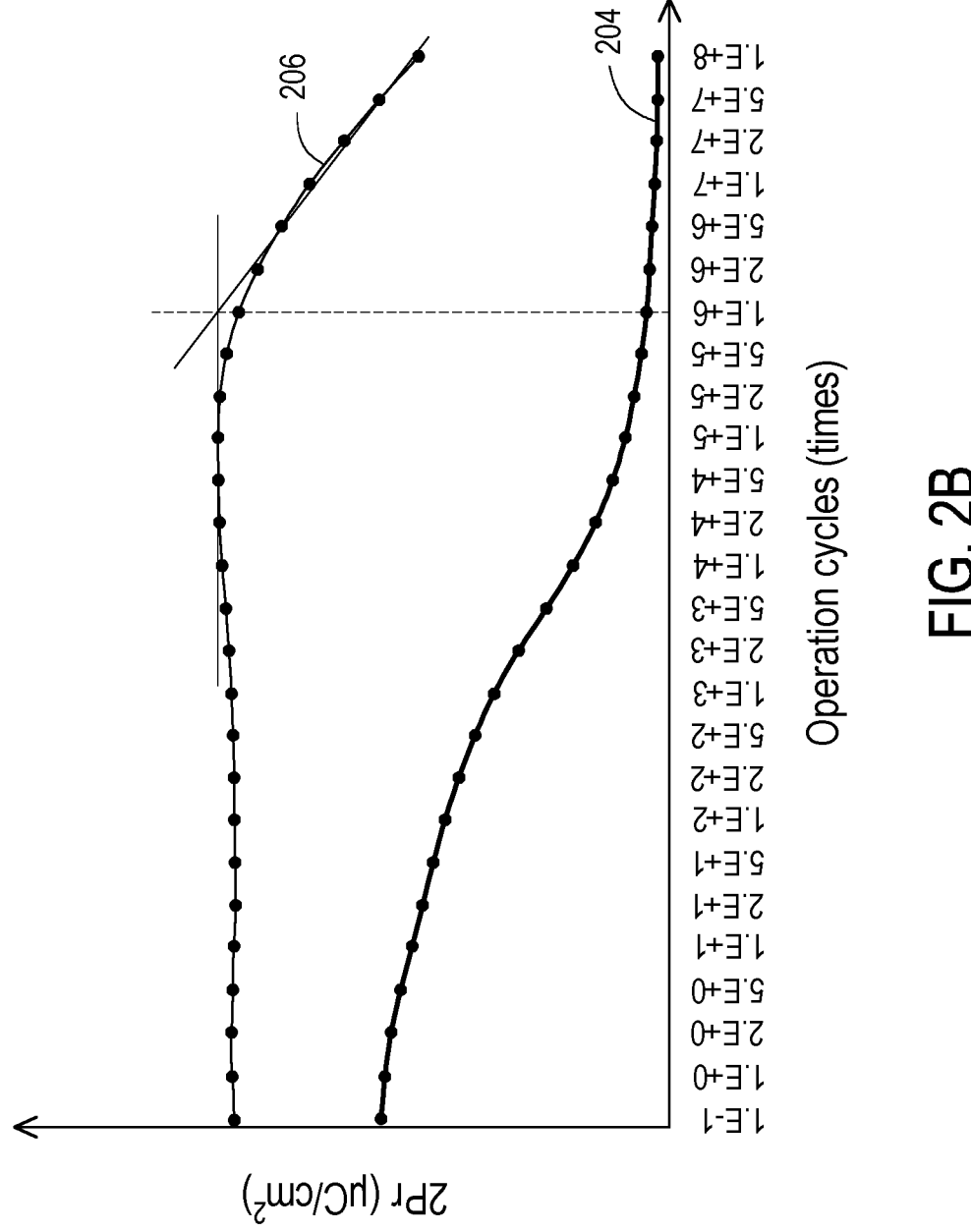
FIG. 2B is a plot diagram showing endurance of the ferroelectric layers in the ferroelectric memory devices (with and without the insertion layer).

FIG. 2B is a plot diagram showing endurances of the ferroelectric layer 102 with and without being covered by the insertion layer 110. A vertical axis in FIG. 2B shows a total remnant polarization 2Pr defined as a difference between the remnant polarizations with opposite polarity in the ferroelectric layer 102, whereas a horizontal axis in FIG. 2B shows numbers of operation cycles performed on the ferroelectric layer 102.

A data curve 204 indicates variation of the total remnant polarization 2Pr in the ferroelectric layer 102 without being covered by the insertion layer 110, with respect to increasing operation cycles. As shown by the data curve 204, the total remnant polarization 2Pr in the ferroelectric layer 102 without being covered by the insertion layer 110 quickly degrades over operation cycles, and is close to zero after $10^6$ times of operation cycles.

On the other hand, a data curve 206 indicates variation of the total remnant polarization 2Pr in the ferroelectric layer 102 being covered by the insertion layer 110, with respect to increasing operation cycles. As shown by the data curves 204, 206, the ferroelectric layer 102 being covered by the insertion layer 110 has a greater total remnant polarization 2Pr, as compared to the ferroelectric layer 102 without being covered by the insertion layer 110. Further, the total remnant polarization 2Pr in the ferroelectric layer 110 being covered by the insertion layer 110 degrades very slowly. At $10^6$ times of operation cycles, the total remnant polarization 2Pr in the ferroelectric layer 110 being covered by the insertion layer 110 is just slightly lower than its maximum value. Therefore, it can be verified that the endurance of the ferroelectric memory device 100 can be effectively improved as well by further disposing the insertion layer 110 between the ferroelectric layer 102 and the channel layer 106.

Referring to FIG. 1 again, the insertion layer 110 is provided as an ultra-thin layer. In some embodiments, a thickness of the insertion layer 110 ranges from 1 Å to 100 Å. If the thickness of the insertion layer 110 is greater than the maximum value, much less or no improvement on total remnant polarization and endurance of the ferroelectric layer 102 might be resulted. Further, since the insertion layer 110 may be electrically conductive, switching behavior of the channel layer 106 underlined with the insertion layer 110 might be disadvantageously affected when the thickness of the insertion layer 110 is greater than the maximum value. As described above, elements in the insertion layer 110 may out diffuse into the ferroelectric layer 102. The thickness of the insertion layer 110 may be evaluated by a number of deposition cycles in the thermal ALD process for forming the insertion layer 110. For instance, around 4 deposition cycles in the thermal ALD process are used for forming the insertion layer 110 to a thickness of 1 Å to 10 Å.

According to some embodiments, an additional insertion layer 112 is disposed between the ferroelectric layer 102 and the gate electrode 104. As similar to the insertion layer 110, the insertion layer 112 is capable of blocking inter-diffusion across an interface between the ferroelectric layer 102 and the gate electrode 104, and passivating dangling bonds at possible defects in the ferroelectric layer 102. In addition, the insertion layer 112 may be electrically conductive as well. A metal carbonitride or a metal nitride may be used for forming the insertion layer 112. Alternatives of the metal carbonitride may include WCN, TaCN, CrCN, TiCN and TaCN, whereas examples of the metal nitride may include WN, TiN and TaN. In some embodiments, the insertion layers 110, 112 are formed of the same metal carbonitride or metal nitride. In alternative embodiments, the insertion layer 112 is formed of a metal carbonitride or metal nitride different from a metal carbonitride or metal nitride of the insertion layer 112. A method for forming the insertion layer 112 may include a thermal ALD process.

During the thermal ALD process, elements 112E of the insertion layer 112 may diffuse into the ferroelectric layer 102. As indicated in FIG. 1, a surface region of the ferroelectric layer 102 that is in contact with the insertion layer 112 is doped with the elements 112E of the insertion layer 112. In addition, the elements 112E diffusing into the ferroelectric layer 102 may be rich in the surface region of the ferroelectric layer 102, and may gradually decrease away from this surface region. Concentration profile of the elements 112E in the ferroelectric layer 102 may vary, according to process temperature of the thermal ALD process and/or material selection of the insertion layer 112 and the ferroelectric layer 102. The present disclosure is not limited to the concentration profile of the elements 112E in the ferroelectric layer 102.

As a difference from the insertion layer 110, a thickness of the insertion layer 112 may be much greater than the thickness of the insertion layer 110. Further, in some embodiments, the insertion layer 112 is further functioned as a work function layer for tuning the threshold voltage of the ferroelectric memory device 100. In these embodiments, work function of the insertion layer 112 is different from work function of the gate electrode 104.

In some embodiments, the ferroelectric memory device 100 is formed with a bottom-gate top-contact configuration. In these embodiments, the ferroelectric layer 102 extends over the gate electrode 104, and the channel layer 106 is disposed on top of the ferroelectric layer 102. In addition, the source/drain contacts 108 are separately formed on the channel layer 106. Optionally, the gate electrode 104 is laterally recessed with respect to an overlying stacking structure including the insertion layer 112, the ferroelectric layer 102, the insertion layer 110 and the channel layer 106. Moreover, a plurality of the ferroelectric memory device 100 may be embedded and arranged as an array in a back-end-of-line (BEOL) structure of a semiconductor die. Although not shown, the ferroelectric memory device 100 may be buried in a stack of dielectric layers (not shown), along with local and global interconnections of the semiconductor die.

Figure 3:
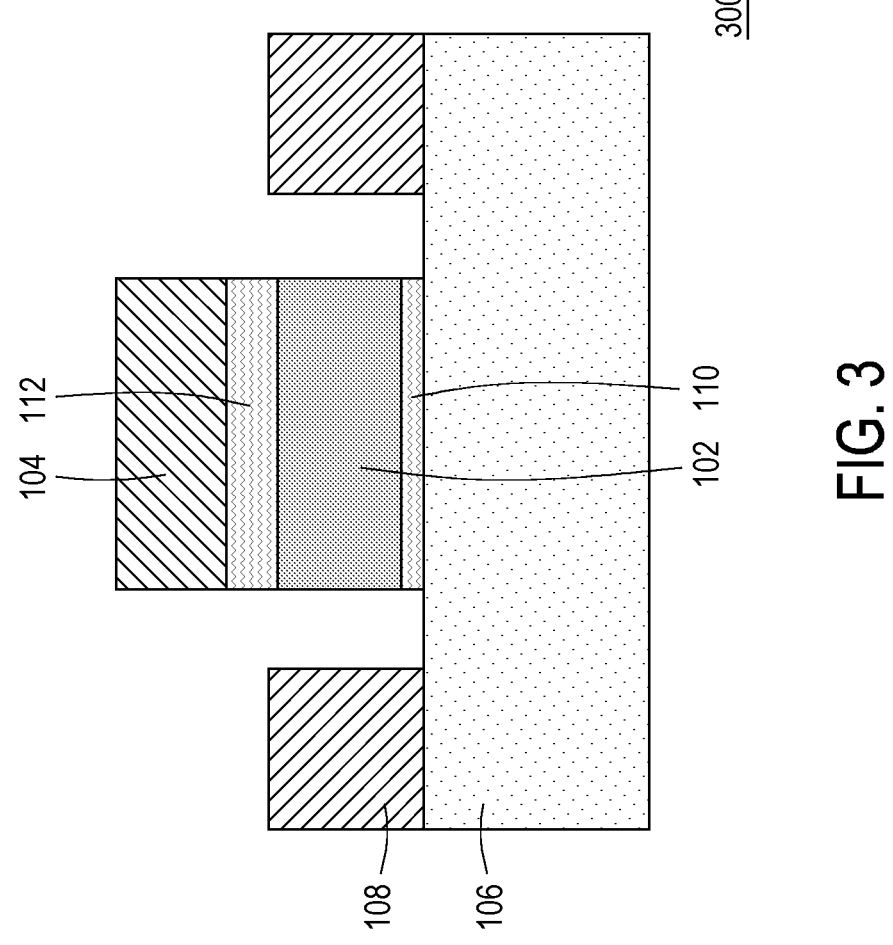
FIG. 3 is a schematic cross-sectional view illustrating a ferroelectric memory device, according to some embodiments of the present disclosure.

As will be further described, ferroelectric memory devices according to other embodiments may be formed with other configurations FIG. 3 is a schematic cross-sectional view illustrating a ferroelectric memory device 300, according to some embodiments of the present disclosure.

The ferroelectric memory device 300 is similar to the ferroelectric memory device 100 as described with reference to FIG. 1A, but is formed with a top-gate top-contact configuration. In the ferroelectric memory device 300, a gate structure including the ferroelectric layer 102 and the gate electrode 104 lying above the ferroelectric layer 102 is disposed on the channel layer 106. In addition, the source/drain contacts 108 are disposed on the channel layer 106 at opposite sides of a gate structure. As similar to the ferroelectric memory device 100 as shown in FIG. 1, the ferroelectric memory device 300 includes the insertion layer 110 sandwiched between the ferroelectric layer 102 and the channel layer 106, and optionally includes the insertion layer 112 lying between the ferroelectric layer 102 and gate electrode 104.

In some embodiments, the channel layer 106 in the ferroelectric memory device 300 is a semiconductor substrate (e.g., a semiconductor wafer or a semiconductor-on-insulator (SOI) wafer). In these embodiments, the ferroelectric memory device 300 is a front-end ferroelectric FET. Further, a plurality of the ferroelectric memory devices 300 may be arranged as an array in a front-end-of-line (FEOL) structure of a semiconductor die, along with other complementary-metal-oxide-semiconductor (CMOS) transistors.

In alternative embodiments, the channel layer 106 in the ferroelectric memory device 300 is a semiconductor layer elevated from a semiconductor substrate. In these alternative embodiments, the ferroelectric memory device 300 is a back-end ferroelectric FET, and a plurality of the ferroelectric memory devices 300 may be embedded and arranged as an array in a back-end-of-line (BEOL) structure of a semiconductor die. Although not shown, the ferroelectric memory devices 300 may be buried in a stack of dielectric layers (not shown), along with local and global interconnections of the semiconductor die.

Figure 4:
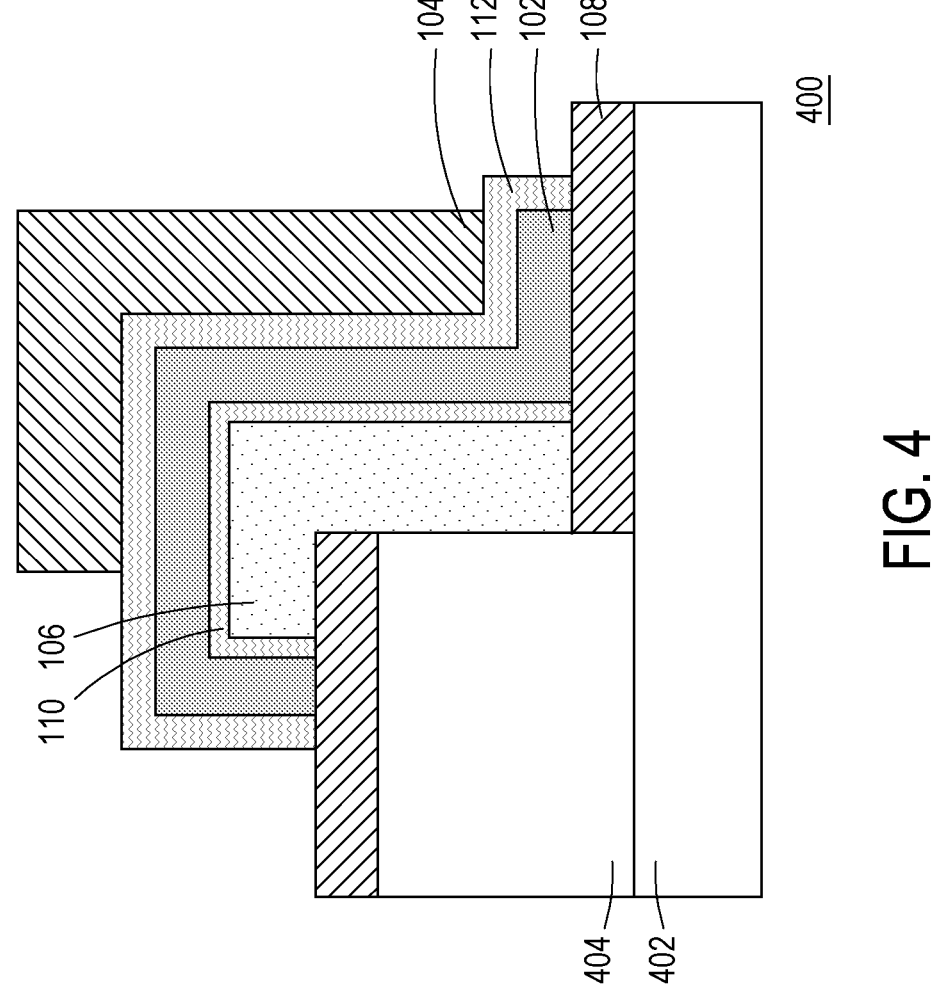
FIG. 4 is a schematic cross-sectional view illustrating a ferroelectric memory device, according to some embodiments of the present disclosure.

FIG. 4 is a schematic cross-sectional view illustrating a ferroelectric memory device 400, according to some embodiments of the present disclosure.

The ferroelectric memory device 400 is similar to the ferroelectric memory device 100 as described with reference to FIG. 1, but is formed with a different configuration. In the ferroelectric memory device 400, the source/drain contacts 108 lie at different heights, and the channel layer 106 as well as the ferroelectric layer 102 extend from one of these heights to the other. Further, the gate electrode 104 may extend along a top surface and a sidewall of the ferroelectric layer 102. As similar to the ferroelectric memory device 100, the ferroelectric memory device 400 includes the insertion layer 110 extending between the ferroelectric layer 102 and the channel layer 106, and optionally includes the channel layer 112 lying between the ferroelectric layer 102 and the gate electrode 104.

As shown in FIG. 4, in some embodiments, one of the source/drain contacts 108 is disposed on a substrate 402, and the other source/drain contact 108 is disposed on a dielectric pattern 404 formed on the substrate 402. In these embodiments, the channel layer 106 may extend from a top surface of one of the source/drain contacts 108 to a top surface of the other source/drain contact 108, through a sidewall of the dielectric pattern 404. In addition, the insertion layer 110, the ferroelectric layer 102 and the insertion layers 112 (if any) may conformally cover the channel layer 106 bridging the source/drain contacts 108. Further, the gate electrode 104 may cover a top corner of the ferroelectric layer 102, and is separated from the source/drain contacts 108. In those embodiments where the ferroelectric memory device 400 includes the insertion layer 112, the gate electrode 104 is in contact with the ferroelectric layer 102 through the insertion layer 112.

In some embodiments, the substrate 402 is a semiconductor substrate (e.g., a semiconductor wafer or a SOI wafer). In these embodiments, a plurality of the ferroelectric memory devices 400 may be arranged as an array in a front-end-of-line (FEOL) structure of a semiconductor die, along with complementary-metal-oxide-semiconductor (CMOS) transistors.

In alternative embodiments, the substrate 402 is a dielectric layer elevated from the semiconductor substrate. In these alternative embodiments, the ferroelectric memory device 400 is a back-end ferroelectric FET, and a plurality of the ferroelectric memory devices 400 may be embedded and arranged as an array in a back-end-of-line (BEOL) structure of a semiconductor die. Although not shown, the ferroelectric memory devices 400 may be buried in a stack of dielectric layers (not shown), along with local and global interconnections of the semiconductor die.

Figure 5:
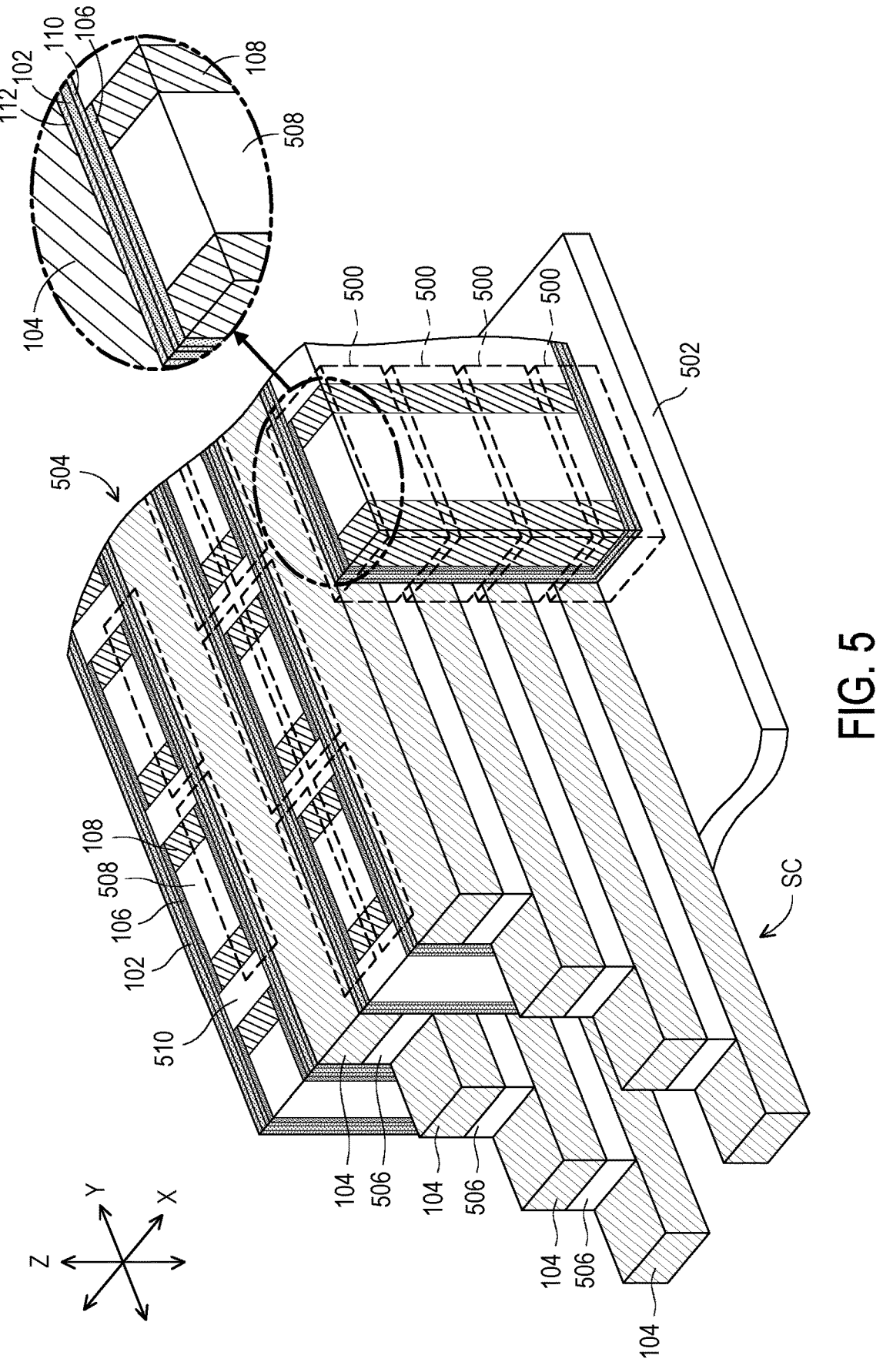
FIG. 5 is a schematic cross-sectional view illustrating an array of ferroelectric memory devices, according to some embodiments of the present disclosure.

FIG. 5 is a schematic cross-sectional view illustrating an array of ferroelectric memory devices 500, according to some embodiments of the present disclosure.

Each of the ferroelectric memory devices 500 is similar to the ferroelectric memory device 100 as described with reference to FIG. 1, but is formed with a different configuration. In addition, the ferroelectric memory devices 500 are arranged as a three-dimensional memory array.

As shown in FIG. 5, the three-dimensional memory array includes stacks of the ferroelectric memory devices 500 formed on a substrate 502. In some embodiments, the substrate 502 is an insulating layer elevated from a semiconductor substrate (not shown), such as a semiconductor wafer or a SOI wafer. In these embodiments, active devices (e.g., transistors) and interconnections for routing these active devices (both not shown) may be formed on the semiconductor wafer (or the SOI wafer) and lying below the substrate 502. In alternative embodiments, the substrate 502 is the semiconductor wafer or the SOI wafer.

The stacks of ferroelectric memory devices 500 are arranged in columns respectively extending along a direction Y (also referred as a column direction). These columns are deployed along a direction X (also referred as a row direction) intersected with the direction Y. In order to clearly illustrate elements in each stack of the ferroelectric memory devices 500, a single stack of the ferroelectric memory devices 500 in one of these columns are particularly depicted as solely standing on the substrate 502. Although not shown, there are actually other stacks of the ferroelectric memory devices 500 in this column. As shown in FIG. 5, each stack of the ferroelectric memory devices 500 contain a segment of a stacking structure 504 formed on the substrate 502. A plurality of the stacking structures 504 extend along the column direction (i.e., the direction Y), and are laterally spaced apart from one another along the row direction (i.e., the direction X). The stacks of the ferroelectric memory devices 500 in the same column share the same stacking structure 504, and each stacking structure 504 may be shared by the stacks of the ferroelectric memory devices 500 in adjacent columns.

A plurality of the gate electrodes 104 and multiple isolation layers 506 are each formed in a line shape and alternately stacked along a vertical direction Z in each stacking structure 504. A topmost layer in the stacking structure 504 may be one of the gate electrodes 104 or one of the isolation layers 506. Similarly, a bottommost layer in the stacking structure 504 may be one of the gate electrodes 104 or one of the isolation layers 506. Further, those skilled in the art may adjust the amount of the gate electrodes 104 and the isolation layers 506 in each stacking structure 504, the present disclosure is not limited thereto.

A plurality of the ferroelectric layers 102 span along sidewalls of the stacking structures 504. In some embodiments, each ferroelectric layer 102 covers opposing sidewalls of adjacent stacking structures 504, and extends along a portion of the substrate 502 between these adjacent stacking structures 504. In other words, a sidewall and a bottom surface of each trench between adjacent stacking structures 504 may be covered by one of the ferroelectric layers 102. In alternative embodiments, the ferroelectric layers 102 respectively cover a sidewall of one of the stacking structures 504, and are separated from one another.

A plurality of the channel layers 106 cover surfaces of the ferroelectric layers 102 facing toward trenches between the stacking structures 504. In some embodiments, opposite sidewalls of each stacking structure 504 are respectively covered by laterally separated ones of the channel layers 106, such that each channel layer 106 may be exclusively shared by a stack of the ferroelectric memory devices 500. In these embodiments, cross-talk between adjacent stacks of the ferroelectric memory devices 500 arranged along the direction Y may be prevented. In addition, in some embodiments, the channel layers 106 at opposing sidewalls of adjacent stacking structures 504 are laterally spaced apart. In alternative embodiments, the channel layers 106 covering opposing sidewalls of each trench between adjacent stacking structures 504 are connected with each other by a bottom portions extending along a portion of the substrate 502 between the adjacent stacking structures 504.

A plurality of the insertion layers 110 are respectively sandwiched between each of the channel layers 106 and the covered ferroelectric layer 102. In some embodiments, the insertion layers 110 respectively have a pattern/shape substantially identical with a pattern/shape of each ferroelectric layer 102. In these embodiments, the ferroelectric layers 102 may be entirely overlapped with the insertion layers 110. In alternative embodiments, the insertion layers 110 respectively have a pattern/shape substantially identical with a pattern/shape of each channel layer 106. In these alternative embodiments, the insertion layers 110 may be entirely overlapped with the channel layers 106.

In some embodiments, a plurality of insertion layers 112 are respectively sandwiched between each ferroelectric layer 102 and the covered stacking structure(s) 504. In some embodiments, the insertion layers 112 respectively have a pattern/shape substantially identical with a pattern/shape of each ferroelectric layer 102. In these embodiments, the ferroelectric layers 102 may be entirely overlapped with the insertion layers 112.

Pairs of the source/drain contacts 108 (respectively formed as conductive pillars) stand on the portions of the substrate 502 between the stacking structures 504. The source/drain contacts 108 in each pair are separately in lateral contact with the channel layer(s) 106 covering opposing sidewalls of adjacent stacking structures 504. Further, adjacent pairs of the source/drain contacts 108 arranged along the direction Y are laterally separated as well. In some embodiments, isolation structures 508 are respectively filled between the source/drain contacts 108 in the same pair. In addition, in some embodiments, isolation pillars 510 respectively stand between adjacent pairs of the source/drain contacts 108 in the same trench. In these embodiments, channel layers 106 disposed along a sidewall of one of the stacking structures 504 are separated from one another by the isolation pillars 510 standing aside this stacking structure 504. Moreover, in some embodiments, pairs of the source/drain contacts 108 at a side of a stacking structure 504 are offset along the direction Y from pairs of the source/drain contacts 108 at the other side of the stacking structure 504. In these embodiments, the stacks of ferroelectric memory devices 500 may be referred as being arranged in a staggered configuration.

A segment of one of the gate electrodes 104 and portions of the insertion layers 112 (if any), the ferroelectric layer 102, the insertion layer 110, the channel layer 106 and a pair of source/drain contacts 108 in lateral contact with the segment of the gate electrode 104 collectively form one of the ferroelectric memory devices 500, which may be a ferroelectric FET. The ferroelectric memory devices 500 in the same stack may share the same ferroelectric layer 102, the same channel layer 106, and the same pair of the source/drain contacts 108, while being controlled by different gate electrodes 104 in the same stacking structure 504. Adjacent stacks of the ferroelectric memory devices 500 at opposite sides of a pair of the source/drain contacts 108 may share this pair of the source/drain contacts 108, while having different channel layers 106 and being controlled by the gate electrodes 104 in adjacent ones of the stacking structures 504. Adjacent stacks of the ferroelectric memory devices 500 at opposite sides of the same stacking structure 504 may share the gate electrodes 104 in this stacking structure 504, while having different ferroelectric layers 102, different channel layers 106 and different pairs of the source/drain contacts 108. In addition, adjacent stacks of the ferroelectric memory devices 500 in the same column may share the same ferroelectric layer 102 and the gate electrodes 104 in the same stacking structure 504, while having different channel layers 106 and different pairs of the source/drain contacts 108.

In some embodiments, end portions of the stacking structures 504 are shaped into staircase structures SC, and the gate electrodes 104 extend to steps of the staircase structures SC. An end portion of each gate electrode 104 in a stacking structure 504 (except for the topmost gate electrode 104) laterally protrudes with respect to an end portion of an overlying gate electrode 104 in the same stacking structure 504 along the column direction (i.e., the direction Y), to form a step of the staircase structure SC. In this way, each of the gate electrodes 104 may have an end portion not covered by others of the gate electrodes 104, thus can be independently out-routed. In some embodiments, an end portion of each isolation layer 506 in a stacking structure 504 is aligned with an end portion of an overlying gate electrode 104, and defines a bottom portion of a step. In these embodiments, each step of a staircase structure SC consists of end portions of one of the gate electrodes 104 and an underlying isolation layer 506. It should be noted that, FIG. 5 merely shows the staircase structures SC at a single side of the memory array. However, opposite sides of each stacking structure 504 may be respectively shaped into a staircase structure SC.

Up to here, the ferroelectric memory devices as ferroelectric FETs with different configurations have been described. Variations to these ferroelectric memory devices will be discussed in further embodiments.

Figure 6A:
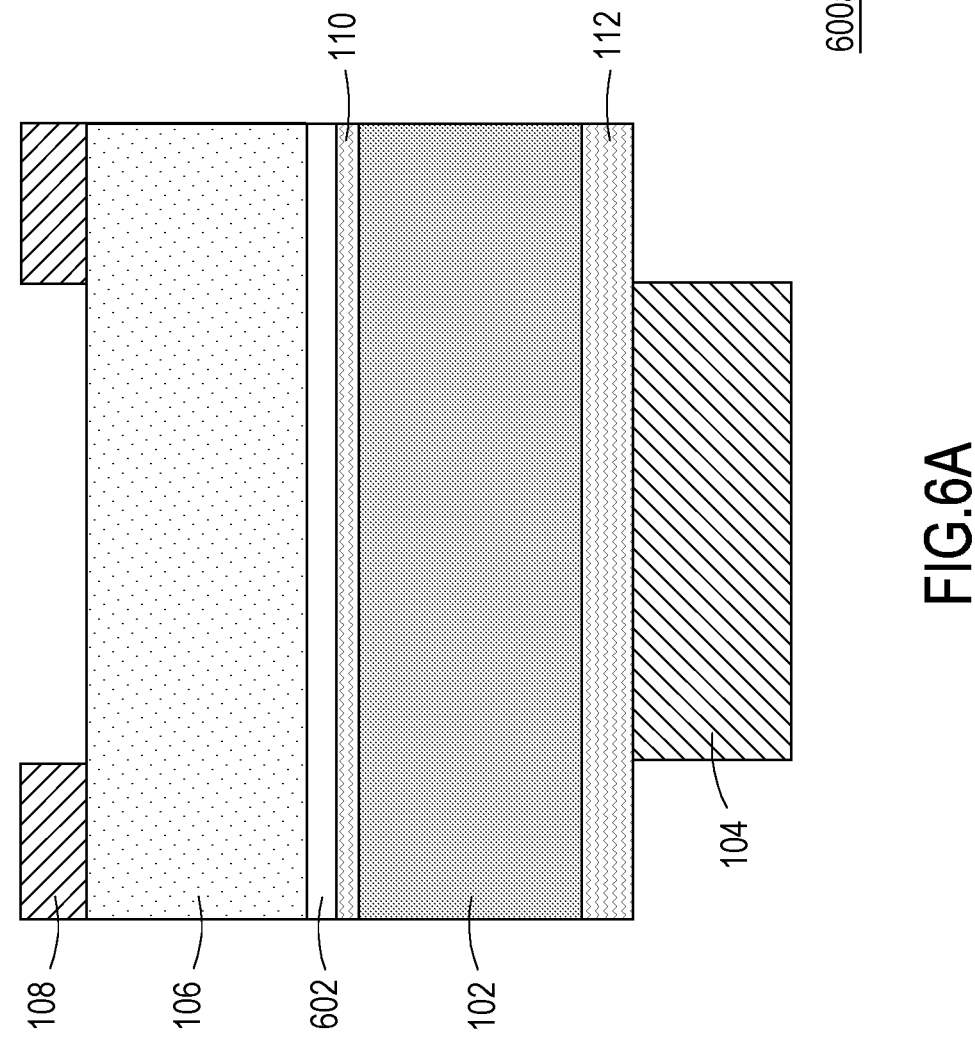
FIG. 6A is a schematic cross-sectional view illustrating a ferroelectric memory device, according to some embodiments of the present disclosure.

FIG. 6A is a schematic cross-sectional view illustrating a ferroelectric memory device 600a, according to some embodiments of the present disclosure.

The ferroelectric memory device 600a is similar to the ferroelectric memory device 100 described with reference to FIG. 1, except that the ferroelectric memory device 600a further includes a dielectric layer 602 lying between the insertion layer 110 and the channel layer 106, and a metal-ferroelectric-insulator-semiconductor (MFIS) type ferroelectric FET is resulted. By further disposing the dielectric layer 602, a leakage path across an interface between the channel layer 106 and the ferroelectric layer 102 may be cut off. Therefore, the ferroelectric memory device 600a may have improved switching behavior and/or data retention ability. A material of the dielectric layer 602 may be selected to increase conduction band offset at an interface between the channel layer 106 and the dielectric layer 602. Alternatives of the material for forming the dielectric layer 602 may include silicon oxide, aluminum oxide or any other large bandgap dielectric material.

As similar to the variation described with reference to FIG. 6A, such dielectric layer 602 may further interpose between the channel layer 106 and the insertion layer 110 in each of the ferroelectric memory device 300 as shown in FIG. 3, the ferroelectric memory device 400 as shown in FIG. 4 and each ferroelectric memory device 500 as shown in FIG. 5.

Figure 6B:
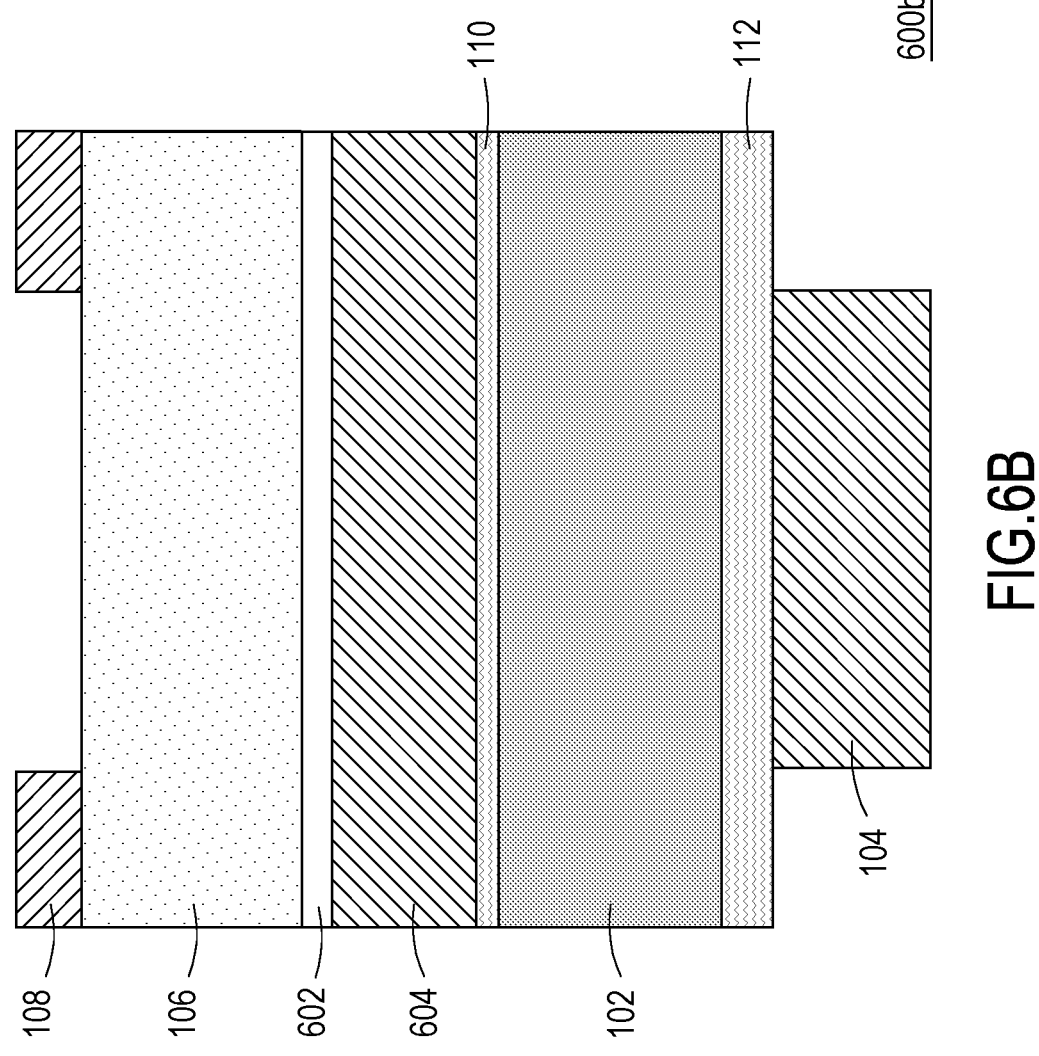
FIG. 6B is a schematic cross-sectional view illustrating a ferroelectric memory device, according to some embodiments of the present disclosure.

FIG. 6B is a schematic cross-sectional view illustrating a ferroelectric memory device 600b, according to some embodiments of the present disclosure.

The ferroelectric memory device 600b is similar to the ferroelectric memory device 600a described with reference to FIG. 6A, except that the ferroelectric memory device 600b further includes a floating gate 604 lying between the insertion layer 110 and the dielectric layer 602, and a metal-ferroelectric-metal-insulator-semiconductor (MFMIS) type ferroelectric FET is resulted. The floating gate 604 can act as an equipotential layer, such that an effect area of the ferroelectric layer 102 (a portion of the ferroelectric layer 102 that is subjected to polarization) is enlarged, so as to saturate polarization of the ferroelectric layer 102 at a rather low programming voltage. The floating gate 604 is formed of a conductive material. Alternatives of the conductive material may include titanium nitride (TiN), tantalum nitride (TaN), tungsten and other metallic materials.

As similar to the variation described with reference to FIG. 6B, such dielectric layer 602 and the floating gate 604 may further interpose between the channel layer 106 and the insertion layer 110 in each of the ferroelectric memory device 300 as shown in FIG. 3, the ferroelectric memory device 400 as shown in FIG. 4 and each ferroelectric memory device 500 as shown in FIG. 5.

In addition to ferroelectric FETs of different types and configurations, a ferroelectric memory device may further include a ferroelectric capacitor.

Figure 7A:
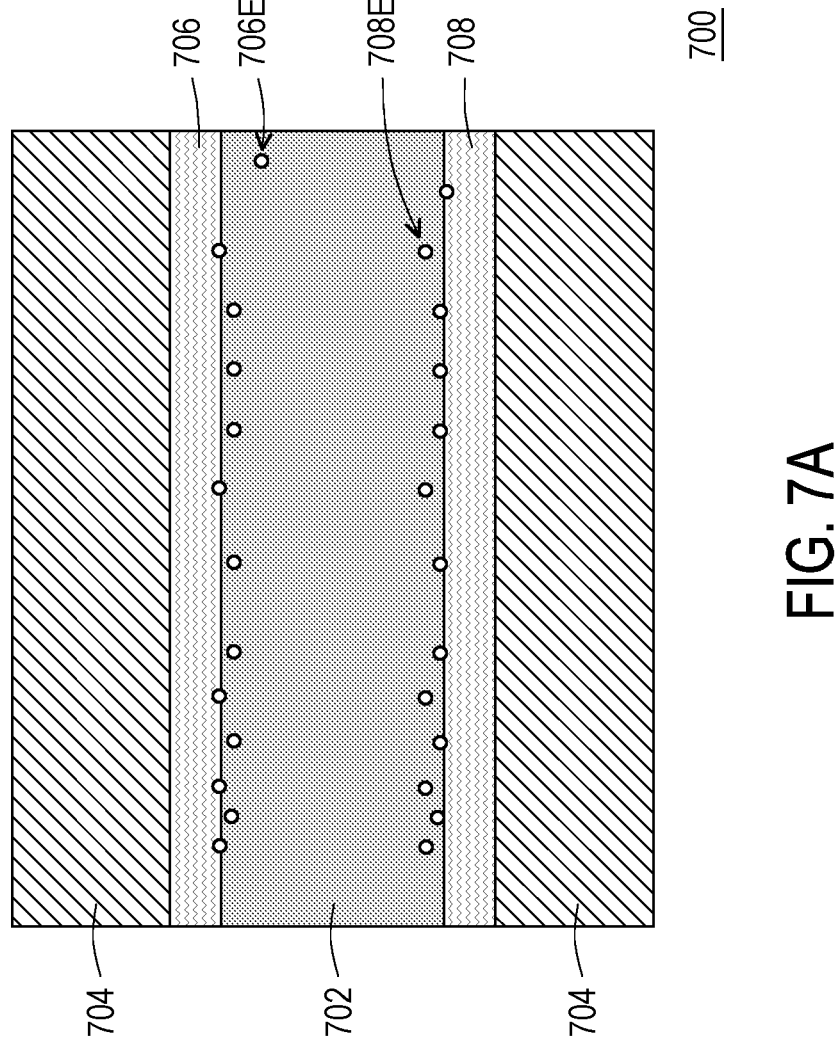
FIG. 7A is a schematic cross-sectional view illustrating a ferroelectric memory device, according to some embodiments of the present disclosure.

FIG. 7A is a schematic cross-sectional view illustrating a ferroelectric memory device 700, according to some embodiments of the present disclosure.

Referring to FIG. 7A, the ferroelectric memory device 700 is a ferroelectric capacitor that includes a ferroelectric layer 702 and a pair of electrodes 704 lying at opposite sides of the ferroelectric layer 702. The ferroelectric layer 702 is substantially identical with the ferroelectric layer 102 described with reference to FIG. 1, and each of the electrodes 704 is substantially identical with the gate electrode 104 described with reference to FIG. 1. The ferroelectric layer 702 can be programmed with and switched between the first and second polarization states with opposite polarity, by controlling a voltage difference between the electrodes 704. Binary logic data can be stored in the ferroelectric layer 702 as the first and second polarization states, and can remain in the ferroelectric layer 702 even at absence of the voltage applied across the ferroelectric layer 702. To read the data stored in the ferroelectric layer 702, a read voltage may be provided to one of the electrodes 704, and a reference voltage (e.g., a ground voltage) is provided to the other electrode 704. If a polarity of the polarization state stored in the ferroelectric layer 702 is opposite to a polarity of the read voltage, the ferroelectric layer 702 is switched to the other polarization state, and a current pulse as a result of the switching may be sensed at the electrode 704 coupled to the reference voltage. On the other hand, if the polarity of the polarization state programmed in the ferroelectric layer 702 is aligned with the polarity of the read voltage, no polarization switching would occur, thus such current pulse at the electrode 704 coupled to the reference voltage may be absent. As the read operation is destructive, a restore process for writing the data back to the ferroelectric layer 102 may be performed after the read operation.

As similar to the ferroelectric memory devices 100, 300, 400, 500, 600a, 600b described with reference to FIG. 1, FIG. 3, FIG. 4, FIG. 5, FIG. 6A and FIG. 6B, an insertion layer 706 is further disposed between the ferroelectric layer 702 and one of the electrodes 704, for blocking interdiffusion between the ferroelectric layer 702 and this electrode 704, and/or for passivating dangling bonds at possible defects in the ferroelectric layer 702. Similarly, another insertion layer 708 may be disposed between the ferroelectric layer 702 and the other electrode 704. The insertion layers 706, 708 may be each identical with the insertion layers 110, 112 in terms of material selection and formation method. That is, the insertion layers 706, 708 may be each formed of a metal carbonitride (e.g., WCN, TaCN, CrCN, TiCN or TaCN) or a metal nitride (e.g., WN, TiN or TaN), and each formed by using a thermal ALD process. Some elements 706E of the insertion layer 706 as well as some elements 708E of the insertion layer 708 may diffuse into the ferroelectric layer 702 as a result of thermal energy provided during formation. As a result, surface regions of the ferroelectric layer 702 in contact with the insertion layers 706, 708 are doped with the elements 706E, 708E of the insertion layers 706, 708. Metal content of the insertion layers 706, 708 may block the inter-diffusion between the ferroelectric layer 702 and the electrodes 704, whereas nitrogen and carbon of the insertion layers 706, 708 may passivate the dangling bonds at the possible defects in the ferroelectric layer 702.

As a difference from the insertion layers 110, 112 described with reference to FIG. 1, each of the insertion layers 706, 708 is in contact with an electrode layer, rather than a channel layer. According to some embodiments, the insertion layers 706, 708 are respectively formed to a thickness ranging from 1 Å to 100 Å. Further, the insertion layers 706, 708 may have substantially identical with thickness. Alternatively, the thickness of the insertion layer 706 is less or greater than the thickness of the insertion layer 708.

Unlike a ferroelectric FET (e.g., the ferroelectric memory devices 100, 300, 400, 500, 600a, 600b as shown in FIG. 1, FIG. 3, FIG. 4, FIG. 5, FIG. 6A and FIG. 6B), the ferroelectric memory device 700 as a ferroelectric capacitor may require a selector for controlling access of the ferroelectric memory device 700.

Figure 7B:
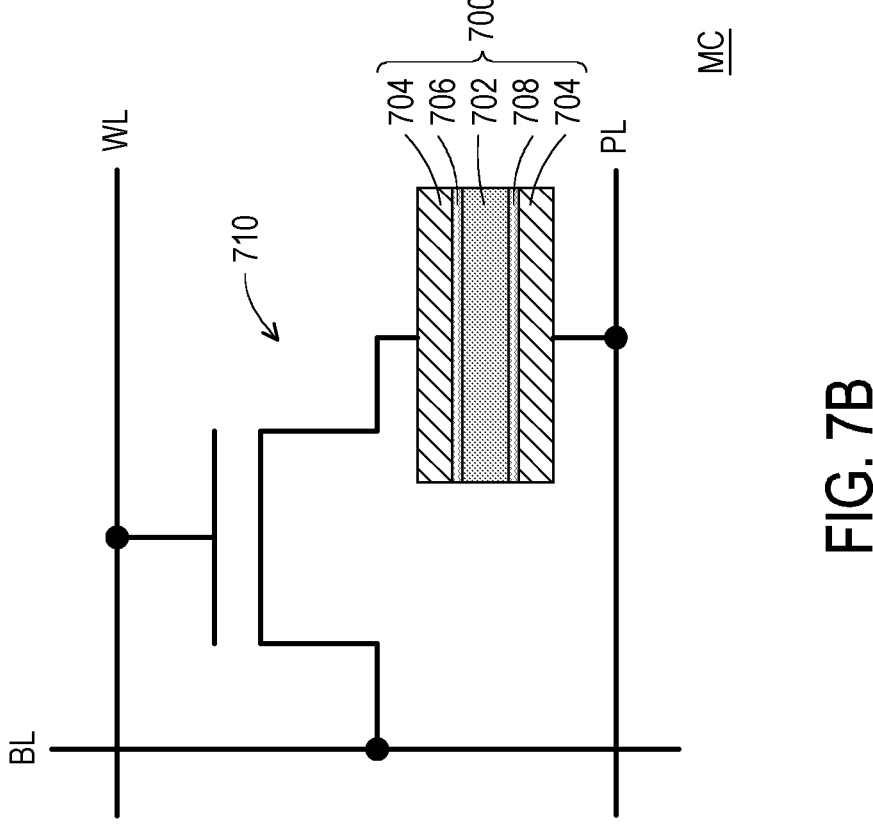
FIG. 7B is a schematic diagram illustrating a memory cell in a memory array, according to some embodiments of the present disclosure.

FIG. 7B is a schematic diagram illustrating a memory cell MC in a memory array, according to some embodiments of the present disclosure.

In addition to the ferroelectric memory device 700 as described with reference to FIG. 7A, the memory cell MC includes a selector 710 for controlling access of the ferroelectric memory device 700. The selector 710 is a FET, which can be formed in a FEOL structure or a BEOL structure of a semiconductor die. A source/drain terminal of the selector 710 may be coupled to one of the electrodes 704 in the ferroelectric memory device 700, and the other source/drain terminal of the selector 710 may be coupled to a bit line BL. Further, a gate terminal of the selector 710 may be coupled to a word line WL, and the other electrode 704 of the ferroelectric memory device 700 may be coupled to a plate line PL. In this way, switching of a conduction channel between the source/drain terminals of the selector 710 can be controlled by the word line WL. When the word line WL is asserted, the conduction channel is established, and a voltage applied across the ferroelectric memory device 700 can be controlled by the bit line BL and the plate line PL. Otherwise, the conduction channel is cut off, and the ferroelectric memory device 700 becomes inaccessible.

The memory array may include a plurality of the memory cells MC arranged along rows and columns. In some embodiments, a row of the memory cells MC share the same word line WL and the same plate line PL, while a column of the memory cells MC share the same bit line BL.

Up to here, various ferroelectric memory devices according to plenty of embodiments have been described. Some of these ferroelectric memory devices are ferroelectric FETs, and can be respectively employed as a memory cell of a memory array. Another one of these ferroelectric memory devices is a ferroelectric capacitor, and can be functioned as a storage unit in a memory cell of a memory array. Each of these memory arrays can be formed in a stand-alone memory or an embedded memory.

Figure 8:
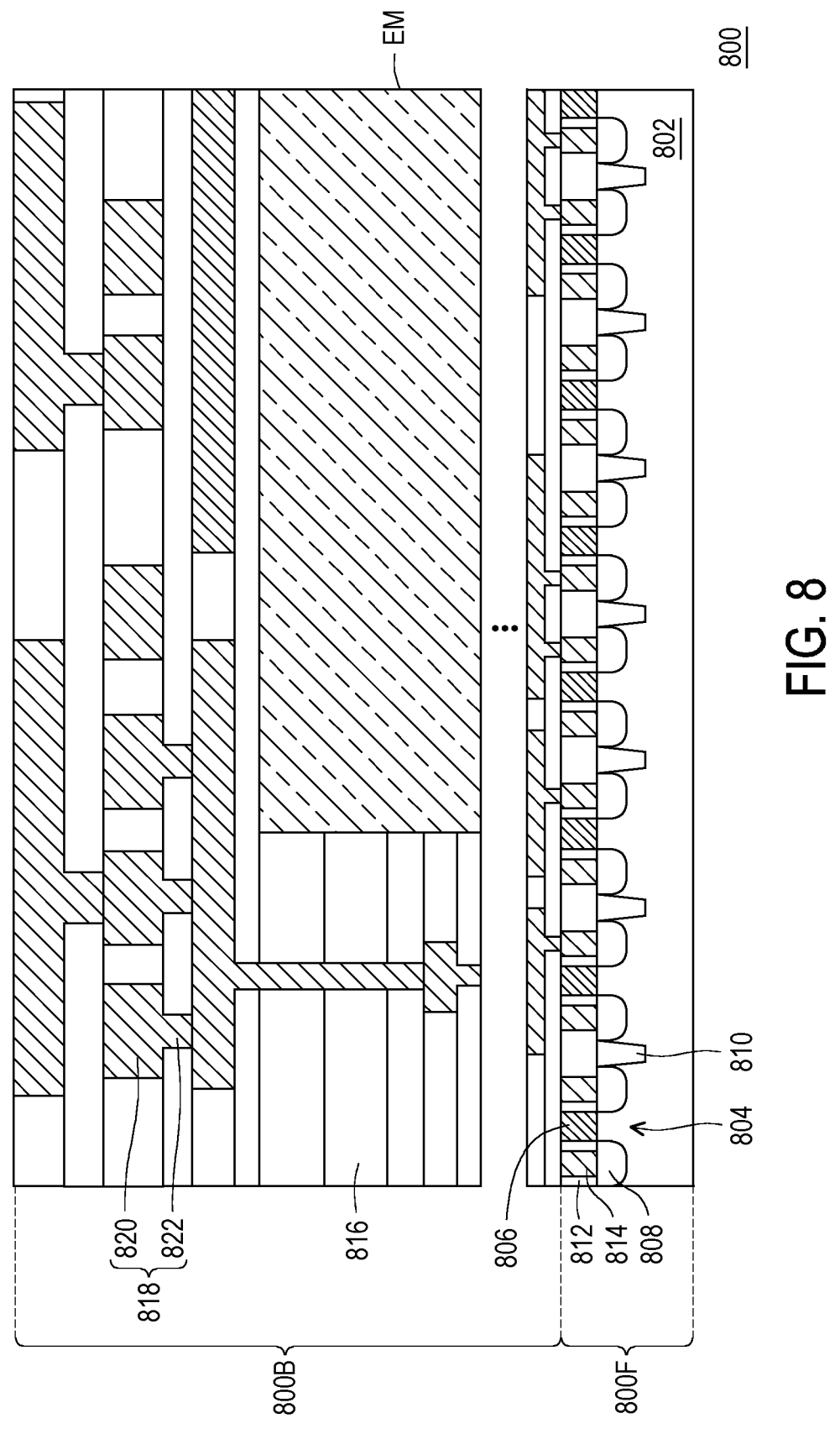
FIG. 8 is a schematic cross-sectional view illustrating a semiconductor die including an embedded memory, according to some embodiments of the present disclosure.

FIG. 8 is a schematic cross-sectional view illustrating a semiconductor die 800 including an embedded memory EM, according to some embodiments of the present disclosure.

Referring to FIG. 8, the semiconductor die 800 has a front-end-of-line (FEOL) structure 800F built on a semiconductor substrate 802, and includes a back-end-of-line (BEOL) structure 800B disposed on the FEOL structure 800F. The embedded memory EM is integrated in the BEOL structure 800B. The afore-described ferroelectric memory devices as ferroelectric FETs can be respectively functioned as a memory cell, and a plurality of the memory cells may be arranged as an array in the embedded memory EM. Alternatively, the afore-described ferroelectric memory device as a ferroelectric capacitor may be functioned as a storage unit in a memory cell, and a plurality of the memory cells may be arranged as an array in the embedded memory EM.

The FEOL structure 800F may include transistors (or referred to as front-end transistors) 804. Each of the transistors 804 may include a gate structure 806 and a pair of source/drain structures 808 at opposite sides of the gate structure 806. Further, adjacent transistors 804 may be isolated from one another by an isolation structure 810 formed in the semiconductor substrate 802. In some embodiments, the transistors 804 are planar type transistors. In these embodiments, the gate structures 806 are formed on planar portions of the semiconductor substrate 802, and the source/drain structures 808 may be formed in the semiconductor substrate 802. In alternative embodiments, the transistors 804 are fin type transistors or gate-all-around (GAA) transistors. In these alternative embodiments, the semiconductor substrate 802 may be shaped to form fin structures at its top surface, or stacks of channel structures (e.g., stacks of semiconductor nanosheets) may be formed on the semiconductor substrate 802. Each fin structure/channel structure may extend between a pair of the source/drain structures 808. In addition, the gate structures 806 may intersect and cover the fin structures or the stacks of channel structures. Moreover, the FEOL structure 800F may further include a dielectric layer 812 and contact structures 814 formed in the dielectric layer 812. The contact structures 814 penetrate through the dielectric layer 812, to establish electrical contact with the source/drain structures 808.

The BEOL structure 800B may include a stack of interlayer dielectric layers 816. For conciseness, only one of the interlayer dielectric layers 816 is labeled. The embedded memory EM is formed in successive ones of the interlayer dielectric layers 816. Further, the BEOL structure 800B also includes conductive elements 818 spreading in the stack of interlayer dielectric layers 816, for interconnecting the transistors 804, and for out-routing the embedded memory EM.

The conductive elements 818 may be distributed below, around and over the embedded memory EM, and may include conductive patterns 820 and conductive vias 822. Each conductive pattern 820 laterally extends in one of the interlayer dielectric layers 816. In addition, each conductive via 822 vertically extends through one or more of the interlayer dielectric layers 816 to establish electrical contact with one or more of the conductive patterns 820, or to establish electrical contact with one of the signal lines in the embedded memory EM. The embedded memory array EM may be routed to some of the transistors 804 in the FEOL structure 800F through some of the conductive elements 818, and can be driven by a driving circuit including these transistors 804. In those embodiments where the embedded memory array EM including a plurality of the ferroelectric memory devices as ferroelectric capacitors, some of the transistors 804 may be used as selectors coupled to these ferroelectric memory devices. Alternatively, the selectors may be provided by back-end transistors also integrated in the embedded memory EM.

Although not shown, passivation layer(s) and electrical connectors as die inputs/outputs (I/Os) may be formed on the BEOL structure 800B.

As above, ferroelectric memory devices according to various embodiments are provided. Each of the ferroelectric memory devices includes a ferroelectric layer, and includes insertion layer(s) lying at a single side or two opposite sides of the ferroelectric layer. Metal content in the insertion layer(s) may block inter-diffusion between the ferroelectric layer and adjacent material layer(s). Further, some elements diffused into the ferroelectric layer from the insertion layer(s) may passivate dangling bonds at possible defects in the ferroelectric layer. As the inter-diffusion between the ferroelectric layer and the adjacent material layer(s) can be prevented and the possible defects in the ferroelectric layer can be passivated, total remnant polarization (2Pr) in the ferroelectric layer can be increased, and endurance of the ferroelectric layer can be effectively improved. Therefore, by further including the insertion layers, the ferroelectric memory devices can be operated with greater memory window and better reliability.

In an aspect of the present disclosure, a ferroelectric memory device is provided. The ferroelectric memory device comprises: a gate electrode; a channel layer, overlapped with the gate electrode; source/drain contacts, in contact with separate ends of the channel layer; a ferroelectric layer, lying between the gate electrode and the channel layer; and a first insertion layer, extending in between the ferroelectric layer and the channel layer, and comprising a metal carbonitride or a metal nitride.

In another aspect of the present disclosure, a ferroelectric memory device is provided. The ferroelectric memory device comprises: a first electrode and a second electrode, overlapped with each other; a ferroelectric layer, sandwiched between the first and second electrodes; a first insertion layer, lying between the ferroelectric layer and the first electrode; and a second insertion layer, lying between the ferroelectric layer and the second electrode, wherein each of the first and second insertion layers comprises a metal carbonitride.

In yet another aspect of the present disclosure, a semiconductor die is provided. The semiconductor die comprises: a semiconductor substrate; front-end transistors, built on a surface of the semiconductor substrate; a stack of dielectric layers, covering the transistors and the semiconductor substrate; and ferroelectric memory devices, formed in the stack of dielectric layers and elevated from the semiconductor substrate, and respectively comprising a ferroelectric layer and an insertion layer separating the ferroelectric layer from an adjacent channel layer or an electrode, wherein the insertion layer comprises metal carbonitride or metal nitride, and a surface region of the ferroelectric layer in contact with the insertion layer is doped with elements of the insertion layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric memory device, comprising:
   a gate electrode;
   a channel layer, overlapped with the gate electrode;
   source/drain contacts, in contact with separate ends of the channel layer;
   a ferroelectric layer, lying between the gate electrode and the channel layer; and
   a first insertion layer, extending in between the ferroelectric layer and the channel layer, and comprising a metal carbonitride or a metal nitride.

2. The ferroelectric memory device according to claim 1, wherein a surface region of the ferroelectric layer in contact with the first insertion layer is doped with elements of the first insertion layer.

3. The ferroelectric memory device according to claim 1, wherein a thickness of the first insertion layer is no greater than 100 Å.

4. The ferroelectric memory device according to claim 1, wherein the first insertion layer is formed of WCN, TaCN, CrCN, TiCN or TaCN.

5. The ferroelectric memory device according to claim 1, wherein the first insertion layer is formed of WN, TiN or TaN.

6. The ferroelectric memory device according to claim 1, further comprising:
   a second insertion layer, lying between the ferroelectric layer and the gate electrode, and comprising a metal carbonitride or a metal nitride.

7. The ferroelectric memory device according to claim 6, wherein a surface region of the ferroelectric layer in contact with the second insertion layer is doped with elements of the second insertion layer.

8. The ferroelectric memory device according to claim 6, wherein the second insertion layer is electrically conductive, and different from the gate electrode in terms of work function.

9. The ferroelectric memory device according to claim 6, wherein the second insertion layer is thicker than the first insertion layer.

10. The ferroelectric memory device according to claim 1, wherein the gate electrode is located at a first side of the channel layer, and the source/drain contacts are disposed at a second side of the channel layer.

11. A ferroelectric memory device, comprising:
   a ferroelectric layer having a first surface and a second surface opposite to each other;
   a channel layer disposed on the first surface of the ferroelectric layer;
   a gate electrode disposed on the second surface of the ferroelectric layer;
   a first barrier layer, extending between the ferroelectric layer and the channel layer, and configured to block an inter-diffusion at an interface between the ferroelectric layer and the channel layer, wherein the first barrier layer comprises a metal carbonitride or a metal nitride; and
   a second barrier layer, extending between the ferroelectric layer and the gate electrode, wherein the second barrier layer and the first barrier layer have different thicknesses.

12. The ferroelectric memory device according to claim 11, wherein the second barrier layer comprises a metal carbonitride or a metal nitride.

13. The ferroelectric memory device according to claim 11, wherein a thickness of the first barrier layer is no greater than 100 Å.

14. The ferroelectric memory device according to claim 11, wherein the second barrier layer is thicker than the first barrier layer.

15. A ferroelectric memory device, comprising:

a ferroelectric layer having a first surface and a second surface opposite to each other;

a channel layer disposed on the first surface of the ferroelectric layer;

a gate electrode disposed on the second surface of the ferroelectric layer; and a first barrier layer, extending between the ferroelectric layer and the channel layer, wherein the first barrier layer has metal elements, and a concentration of the metal elements gradually decreases along a direction from an interface between the first barrier layer and the ferroelectric layer toward the ferroelectric layer.

16. The ferroelectric memory device according to claim 15, further comprising:

a second barrier layer extending between the ferroelectric layer and the gate electrode, wherein the second barrier layer comprises a metal carbonitride or a metal nitride.

17. The ferroelectric memory device according to claim 16, wherein the second barrier layer is thicker than the first barrier layer.

18. The ferroelectric memory device according to claim 15, wherein the second barrier layer is electrically conductive, and different from the gate electrode in terms of work function.

19. The ferroelectric memory device according to claim 15, further comprising:

a first source/drain contact disposed on the channel layer; and a second source/drain contact disposed on the channel layer and laterally offset from the first source/drain contact.

20. The ferroelectric memory device according to claim 11, further comprising:

a first source/drain contact disposed on the channel layer; and a second source/drain contact disposed on the channel layer and laterally offset from the first source/drain contact.

* * * * *